United States Patent [19]

Hebiguchi

[11] Patent Number: 5,598,012
[45] Date of Patent: Jan. 28, 1997

[54] THIN-FILM TRANSISTOR WITH WIDE GATE ELECTRODE AND LIQUID CRYSTAL DISPLAY INCORPORATING SAME

[75] Inventor: Hiroyuki Hebiguchi, Miyagi-ken, Japan

[73] Assignee: Frontec Incorporated, Sendai, Japan

[21] Appl. No.: 534,612

[22] Filed: Sep. 27, 1995

[30] Foreign Application Priority Data

Oct. 13, 1994 [JP] Japan .................................... 6-248184

[51] Int. Cl.$^6$ .................................................. H01L 29/04
[52] U.S. Cl. ................. 257/59; 257/72; 257/347; 257/626; 349/42
[58] Field of Search .................... 257/66, 59, 72, 257/347, 57, 61, 349, 351, 348, 350, 352, 353, 354, 626; 359/59

[56] References Cited

U.S. PATENT DOCUMENTS 5,005,056  4/1991  Motai et al. ............................. 257/66
5,355,002  10/1994  Wu ........................................... 257/66

Primary Examiner—Minhloan Tran
Attorney, Agent, or Firm—Guy W. Shoup; Patrick T. Bever

[57] ABSTRACT

A thin-film transistor for connecting a signal electrode line to a pixel electrode of a liquid crystal display, the thin-film transistor including: a substrate; a gate electrode formed on the substrate; a gate insulating layer formed on the gate electrode; a semiconductor layer formed on the gate insulating layer; an ohmic contact layer formed on the semiconductor layer; a source electrode formed on the ohmic contact layer over a first end of the semiconductor layer; a drain electrode formed on the ohmic contact layer over a second end of the semiconductor layer such that a channel region is formed; and a protective film formed on the gate insulating layer, the source electrode, the channel region of the semiconductor layer, and the drain electrode. A width of the gate electrode is wider than a width of the semiconductor layer. The pixel electrode is connected to the drain electrode through a first hole in the protective film, and the signal electrode line is connected to the source electrode through a second hole in the protective film.

7 Claims, 4 Drawing Sheets

THIN-FILM TRANSISTOR WITH WIDE GATE ELECTRODE AND LIQUID CRYSTAL DISPLAY INCORPORATING SAME

BACKGROUND OF THE INVENTION

1. Field of the Invention

The present invention relates to a thin-film transistor to be used for fabricating a liquid crystal display or the like and, more particularly, to a thin-film transistor that reduces the off-current.

2. Description of the Related Art

Referring to FIG. 5 showing an equivalent circuit of an active matrix liquid crystal display employing thin-film transistors as switching elements, a plurality of parallel scanning electrode lines G1, G2, . . . and Gn, which will be inclusively designated by G, and a plurality of parallel signal electrode lines S1, S2, . . . and Sm, which will be inclusively designated by S, are extended across each other, the scanning electrode lines G are connected to a scanning circuit 1, and the signal electrode lines S are connected to a signal supply circuit 2. Thin-film transistors (switching elements) 3 are formed near the intersection points of the scanning electrode lines G and the signal electrode lines S, respectively. A capacitor 4 and a liquid crystal element 5 are connected in parallel to the drain of each thin-film transistor 3.

In the circuit shown in FIG. 5, the scanning electrode lines G1, G2, . . . and Gn are scanned sequentially to turn on the thin-film transistors 3 on each scanning electrode line G simultaneously, and the signal supply circuit 2 charges through the signal electrode lines S1, S2, . . . and Sm the capacitors 4 corresponding to the liquid crystal elements 5 to be driven, among the capacitors 4 connected to the thin-film transistors 3 in the on-state. The stored signal charges keep exciting the corresponding liquid crystal elements 5 after the thin-film transistors 3 have been turned off until the next scanning cycle is started. Consequently, the liquid crystal elements 5 are controlled by control signals to display picture elements. Thus, the liquid crystal elements are driven statically even though the external driving circuits, i.e., the scanning circuit 1 and the signal supply circuit 2, drive the liquid crystal elements 5 in a time sharing mode.

FIGS. 3 and 6 show a portion of the conventional active matrix liquid crystal display illustrated by the equivalent circuit of FIG. 5. Referring to FIGS. 5 and 6, the scanning electrode lines G and the signal electrode lines S are formed so as to cross each other on a transparent substrate 14, such as a glass substrate, and the thin-film transistor 3 is formed between the scanning electrode line G and the signal electrode line S.

As shown in FIGS. 3 and 6, the thin-film transistor 3 comprises a gate electrode 8 formed by extending a portion of the scanning electrode line G, an insulating layer 16 covering the gate electrode 8, a semiconductor layer 20 of amorphous silicon (a-Si) formed on the insulating layer 16, and a drain electrode 10 and a source electrode 12 formed opposite to each other with a gap therebetween by processing a conductive layer, such as an aluminum layer, formed on the semiconductor layer 20. An ohmic contact layer 22 is formed by doping the upper surface of the semiconductor layer 20. The thin-film transistor 3 shown in FIG. 3 is generally called a thin-film transistor of a channel etch type. The laminated structure thus fabricated is covered with a protective film 18. The drain electrode 10 is connected through a contact hole 24 formed in the protective film 18 to a pixel electrode 15, and the source electrode 12 is connected to the signal electrode line S. A portion of the semiconductor layer 20 corresponding to the gap between the drain electrode 10 and the source electrode 12 is a channel region 26. An orientation film, not shown, is formed on the pixel electrode formed on the protective film 18, a transparent substrate provided with an orientation film is put on the orientation film formed over the pixel electrode, and a liquid crystal is sealed in the space between the orientation films to complete the active matrix liquid crystal display.

An electric field created by the pixel electrode 15 is applied to the molecules of the liquid crystal to control the orientation of the molecules of the liquid crystal. When the transparent substrate 14 is illuminated by light rays emitted by a backlight from behind, the direction of polarization of light rays changes according to the orientation of the liquid crystal, some liquid crystal elements transmits light rays and other liquid crystal elements intercept light rays to display desired pictures.

Since the electrodes and the like that does not transmit light are extended in portions of the liquid crystal display corresponding to the thin-film transistors 3, light rays emitted by the backlight from behind the substrate 14 do not contribute to displaying pictures. However, those light rays fall on the lower surfaces of the thin-film transistors 3. When the backlight is disposed behind the substrate 14 of the liquid crystal display, part of light rays emitted by the backlight and transmitted by the substrate 14 falls on the semiconductor layer 20 as indicated by the arrows A in FIG. 3, and part of the light rays falling on the semiconductor layer 20 is reflected by the inclined portions 28 of the lower surface of the semiconductor layer 20. Consequently, the conductivity of the illuminated semiconductor layer 20 increases and a photocurrent flows. Therefore, when the thin-film transistor 3 is being driven, an undesirable leakage current flows though the circuit is kept in the off-state by the gate electrode 8. The leakage current increases the off-current when driving the liquid crystal, adversely affecting the light transmission characteristic of the liquid crystal display.

If electric charge of a fixed polarity is applied continuously to the liquid crystal, the dc component biases the ions of the orientation film in contact with the liquid crystal, and adsorbed charge creates an electric field which causes sticking. Since the light transmission characteristic of the liquid crystal remains unchanged even if the polarity of the voltage applied to the pixel electrode 15 is reversed, the liquid crystal is driven by an ac voltage to prevent sticking.

However, when the liquid crystal is driven by an ac voltage, a parasitic capacitance is created, and the gate voltage is applied to the pixel electrode 15 and causes the dynamic voltage shift of the potential of the pixel electrode 15. The parasitic capacitance that cause the voltage shift is created because the insulating layer 16 formed in part of the active matrix liquid crystal display functions as a capacitor.

A parasitic capacitance is created in the structure shown in FIG. 3 by the insulating layer 16 formed between the gate electrode 8 and the drain electrode 10. Since a large portion of the drain electrode 10 overlaps the gate electrode 8, the gate-drain capacitance $C_{GD}$ is comparatively large, which increases the parasitic capacitance. The gate-drain capacitance $C_{GD}$ generates switching noise when the liquid crystal is driven. Research and development activities have been made to form the gate electrode 8 in the least possible size so that the portions of the drain electrode 10 and the source electrode 12 overlapping the gate electrode 8 are reduced to suppress the gate-drain capacitance $C_{GD}$ to the least possible extent.

Another problem is the conventional liquid crystal display is that a leakage current flows from the interface between the semiconductor layer 20 and the gate insulating layer 16 to the drain electrode 10 and the source electrode 12, and the off-current increases when the gate voltage is negative. Increase in the off-current reduces the retention and, consequently, the contrast is reduced and power is consumed unnecessarily.

SUMMARY OF THE INVENTION

The present invention has been made in view of the foregoing problems and it is therefore an object of the present invention to provide a thin-film transistor having a structure including a semiconductor layer shielded from light emitted by a backlight or the like to suppress leakage current from the semiconductor layer so that the off-current is reduced.

In a first aspect of the present invention, a thin-film transistor comprises: a substrate, a gate electrode formed on the substrate, a gate insulating layer formed so as to cover the gate electrode and the upper surface of the substrate, a semiconductor layer formed on the gate insulating layer, a source electrode formed on the semiconductor layer, and a drain electrode formed on the semiconductor layer opposite to and spaced from the source electrode. The area of the gate electrode is greater than that of the semiconductor layer, and the source electrode and/or the drain electrode is not formed on a portion of the gate insulating layer near the semiconductor layer.

In a second aspect of the present invention, an ohmic contact layer is formed between the semiconductor layer, and the source electrode and/or the drain electrode.

In a third aspect of the present invention, a backlight is disposed behind the substrate.

Since the gate electrode is broader than the semiconductor layer formed over the gate electrode, light emitted by the backlight and fallen on the back surface of the thin-film transistor is intercepted by the gate electrode that does not transmit light and the light is unable to reach the semiconductor layer formed over the gate electrode. Consequently, any photocurrent is not produced in the channel region in the semiconductor layer and the off-current of the thin-film transistor is low, so that the on/off ratio of the thin-film transistor is improved.

Since the source electrode and/or the drain electrode is not formed on a portion of the gate insulating layer near the semiconductor layer, no leakage current flows from the interface between the semiconductor layer and the gate insulating layer through the drain electrode, so that the off-current can be reduced. Consequently, a liquid crystal display employing the thin-film transistor is capable of displaying pictures in a high contrast, and the power consumption of the liquid crystal display can be reduced.

Since the source electrode and/or the drain electrode is comparatively small, only a small portion of the source electrode and/or the drain electrode overlaps the gate electrode even though the gate electrode is comparatively large, so that the gate-drain capacitance ($C_{GD}$) can be reduced and hence the generation of switching noise when driving the liquid crystal can be avoided.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
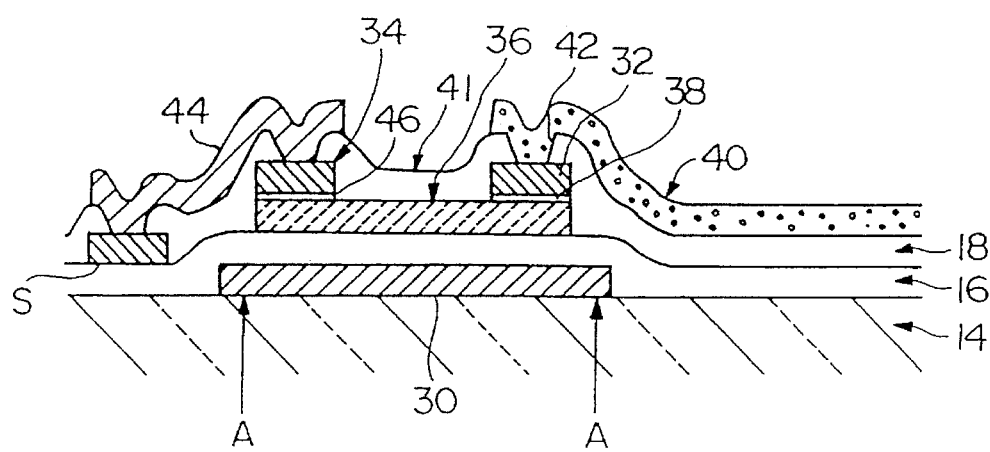
FIG. 1 is a typical sectional view of a thin-film transistor in a preferred embodiment according to the present invention.

Referring to FIG. 1, a thin-film transistor in a preferred embodiment according to the present invention has a transparent substrate 14, such as a substrate of #7059 glass having a refractive index of 1.530 (Corning Co.), a gate electrode 30 of a conductive, light-screening material, such as Cr, Al or Cu, formed on the substrate 14, a gate insulating layer 16, such as a silicon nitride film of about 1.85 in refractive index, formed so as to cover the upper surface of the substrate 14 and the gate electrode 30, a semiconductor layer 36, such as a layer of a-Si, formed on the gate insulating layer 16, a source electrode 34 formed over the gate electrode 30, a drain electrode 32 formed over the gate electrode 30 opposite to the source electrode 34 and spaced apart from the source electrode 34, an ohmic contact layer 46 of n$^+$-type a-SiH or the like formed between the source electrode 34 and the semiconductor layer 36 by ion implantation, and an ohmic contact layer 38 of a-Si or the like formed between the drain electrode 32 and the semiconductor layer 36 by ion implantation. A portion of the semiconductor layer 36 between the source electrode 34 and the drain electrode 32 serves as a channel region 41. The source electrode 34 and the drain electrode 32 are formed of a conductive material, such as Al, Cu or ITO.

Figure 5:
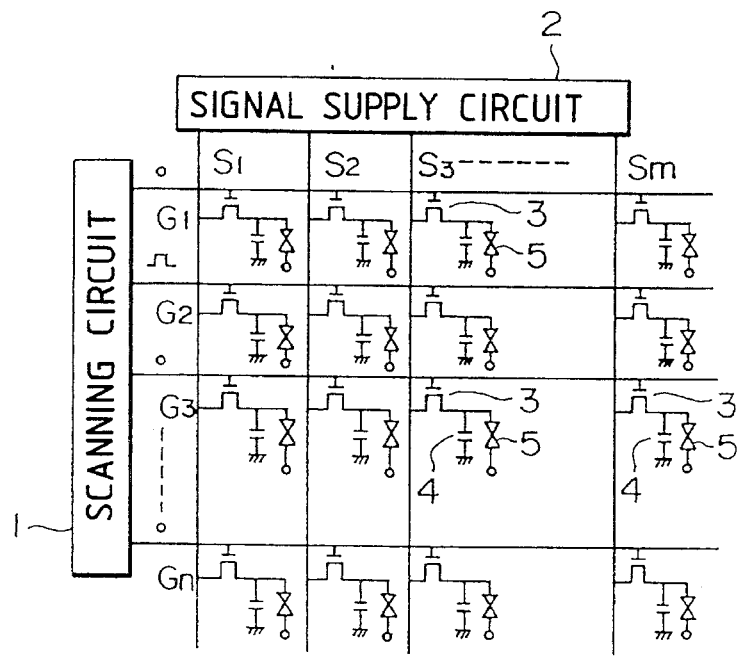
FIG. 5 is a circuit diagram of an equivalent circuit of an active matrix liquid crystal display.
Figure 6:
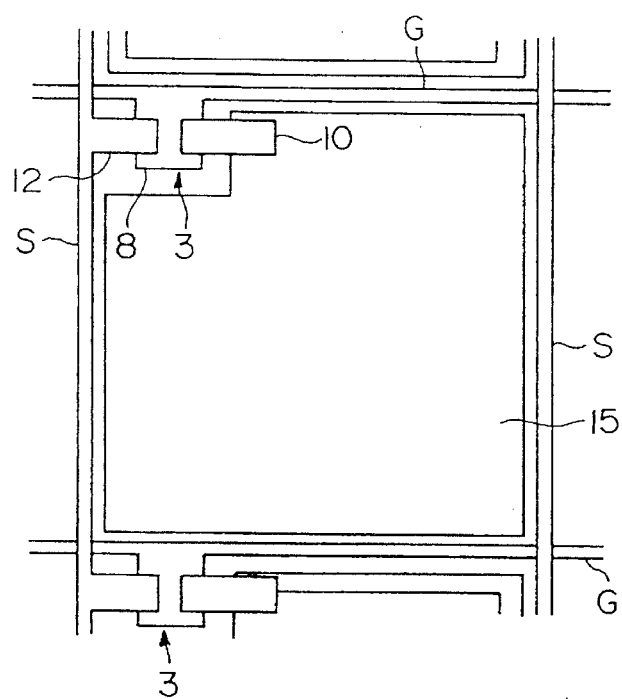
FIG. 6 is an enlarged plan view of one of the pixels of the active matrix liquid crystal display of FIG. 5.

This thin-film transistor, that is shown in FIG. 1, is used as one of the thin-film transistors 3 of the liquid crystal display shown in FIGS. 5 and 6 for driving the liquid crystal. When making a specified pixel element active, signals are applied to the corresponding scanning electrode line G and the corresponding signal electrode line S to apply an electric field to the molecules of the liquid crystal by charging a specified pixel electrode 40 by a specified thin-film transistor 3.

In this thin-film transistor, the gate electrode 30 is broader than the semiconductor layer 36.

Figure 3:
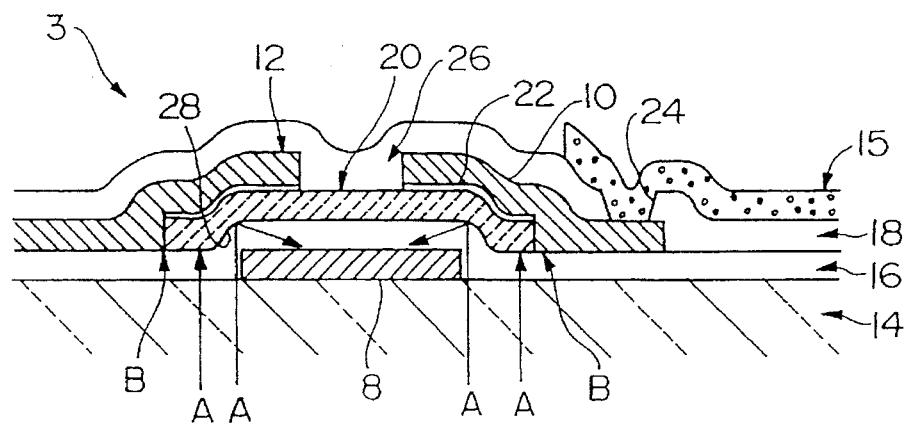
FIG. 3 is a typical sectional view of a conventional thin-film transistor.

While the source electrode 12 and the drain electrode 10 of the conventional thin-film transistor shown in FIG. 3 are formed on the gate insulating layer 16 so as to cover the periphery of the semiconductor layer 20, the source electrode 34 and the drain electrode 32 of the thin-film transistor of the present invention is formed only on the upper surface of the semiconductor layer 36 through the ohmic contact layers 46 and 38, respectively, and are not formed in contact with the gate insulating layer 16; that is, no part of the source electrode 34 and the drain electrode 32 is formed on the gate insulating layer 16 and around the semiconductor layer 36.

The ohmic contact layers 46 and 38 connect the source electrode 34 and the drain electrode 32 to the semiconductor layer 36 in satisfactory ohmic contact, which reduces on-resistance.

The drain electrode 32 is connected to the pixel electrode 40 of ITO or the like through a contact hole 42 formed in a protective film 18 at a position corresponding to the drain electrode 32. The source electrode 34 is connected to a signal electrode line S through a source connector 44 formed on the protective film 18.

Since the gate electrode 30 is broader than the semiconductor layer 36 formed above the gate electrode 30, light emitted by the backlight disposed behind the substrate 14 and traveling in the direction of the arrows A (FIG. 1) is intercepted by the gate electrode 30 and cannot reach the semiconductor layer 36 extending above the gate electrode 30. Consequently, no photocurrent is produced in the channel region 41 of the semiconductor layer 36 and hence the off-current of the thin-film transistor is comparatively low and thereby the on/off ratio, i.e., the ratio of the on-current to the off-current for driving the thin-film transistor, can be improved. Since a portion of the drain electrode 32 overlapping the gate electrode 30 is smaller than that of the drain electrode 10 of the conventional thin-film transistor, the gate-drain capacitance $C_{GD}$, i.e., the parasitic capacitance, is comparatively small and hence switching noise is reduced.

Since the source electrode 34 and the drain electrode 32 are not formed on the gate insulating layer 16 and near the interface between the semiconductor layer 36 and the gate insulating layer 16, no leakage current flows from the interface between the semiconductor layer 36 and the gate insulating layer 16 to the drain electrode 32.

Figure 2:
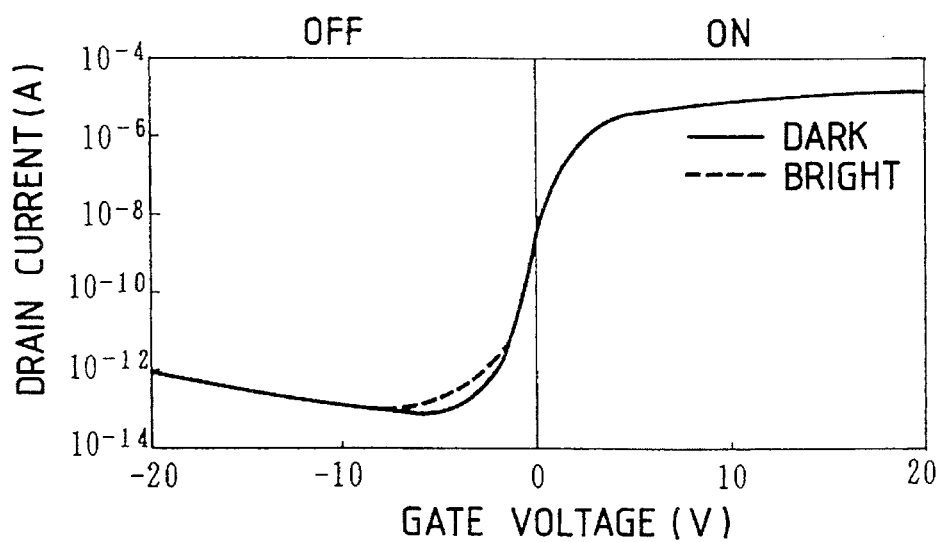
FIG. 2 is a graph showing the variation of drain current with gate voltage in the thin-film transistor of FIG. 1.
Figure 4:
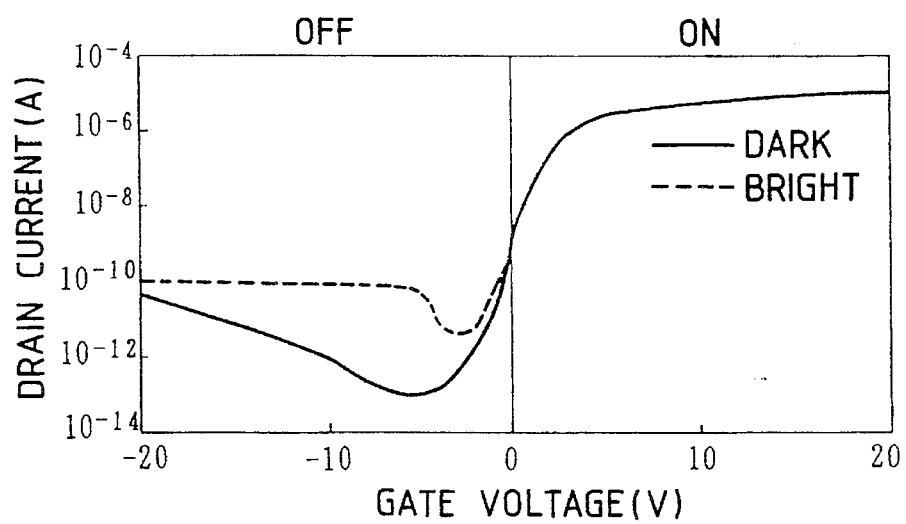
FIG. 4 is a graph showing the variation of drain current with gate voltage in the conventional thin-film transistor of FIG. 3.

FIG. 2 shows the variation of the drain current with the gate voltage in the thin-film transistor of the present invention in an on-region and an off-region, and FIG. 4 shows the variation of the drain current with the gate voltage in the conventional thin-film transistor 3. In each of FIGS. 2 and 4, a broken line indicates the relation between the drain current and the gate voltage when the backlight is turned on, and a continuous line indicates the relation when the backlight is turned off.

As is obvious from FIG. 4, when the backlight is turned on, a drain current on the order of $1 \times 10^{-10}$ A flows in the conventional thin-film transistor 3 if the gate voltage is $-5$ V or below, which adversely affects the contrast. Such a phenomenon is inferred to be attributable to a photocurrent produced due to the illumination of the semiconductor layer 20 by the light emitted by the backlight. Even if the backlight is in the off-state, the drain current increases as the gate voltage decreases in the off-region, which is inferred to be the leakage of a current from the interface between the semiconductor layer 20 and the gate insulating layer 16 into the drain electrode 10.

Figure 7:
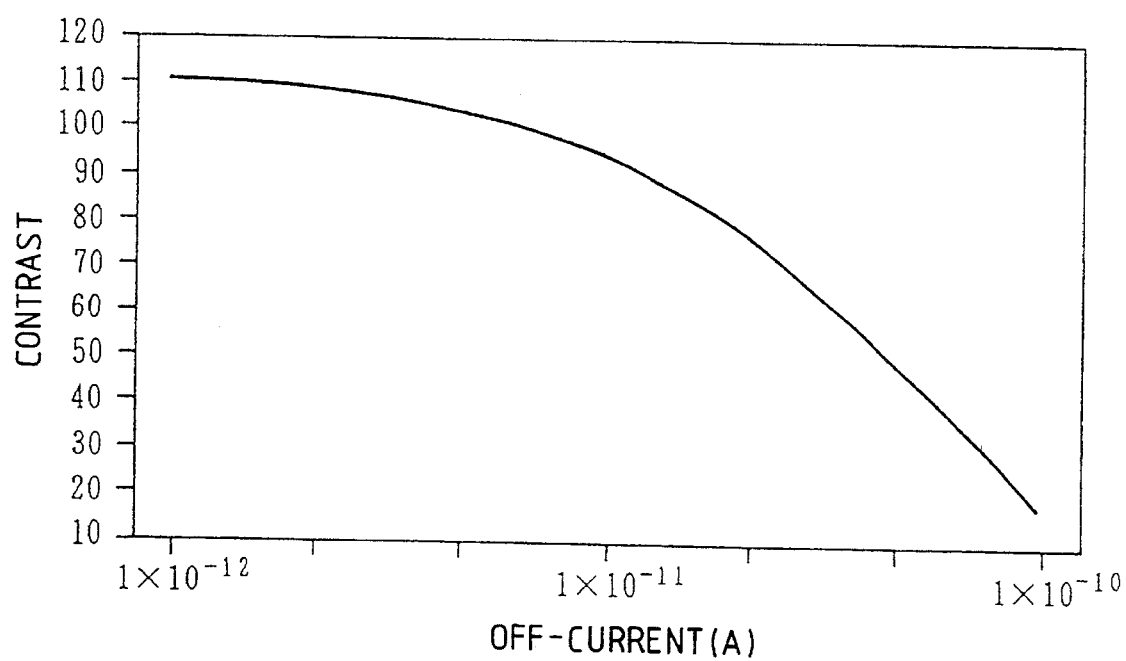
FIG. 7 is a graph showing the variation of contrast with off-current.

As is obvious from FIG. 2, in the thin-film transistor of the present invention, the drain current increases very slightly with the decrease of the gate voltage and any photocurrent is produced even if the backlight is in the on-state, which proves that the drain current is affected scarcely the the light emitted by the backlight. Thus, the present invention reduces the off-current of the thin-film transistor, for example, from $1 \times 10^{-10}$ A to $1 \times 10^{-12}$, so that contrast can be enhanced greatly from about 20 to about 110 as shown in FIG. 7 and power consumption can be reduced.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A thin-film transistor for selectively applying a signal from a signal electrode line to a pixel electrode of a liquid crystal display, the thin-film transistor comprising:

a substrate;

a gate electrode formed on the substrate, the gate electrode having a first width measured in a first direction;

a gate insulating layer formed on the gate electrode;

a semiconductor layer formed on the gate insulating layer, the semiconductor layer having a second width measured in the first direction and including opposing first and second ends and a channel region located between the first and second ends;

an ohmic contact layer formed on the semiconductor layer;

a source electrode formed on the ohmic contact layer over the first end of the semiconductor layer;

a drain electrode formed on the ohmic contact layer over the second end of the semiconductor layer such that the drain electrode is spaced apart from source electrode by the channel region of the semiconductor layer; and a protective film formed on the gate insulating layer, the source electrode, the channel region of the semiconductor layer, and the drain electrode;

wherein the pixel electrode is electrically connected to the drain electrode through a first hole in the protective film;

wherein the signal electrode line is electrically connected to the source electrode through a second hole in the protective film;

wherein the first width of the gate electrode is greater than the second width of the semiconductor layer, and wherein the source electrode and the drain electrode are formed between the first and second ends of the semiconductor layer.

2. The thin-film transistor according to claim 1, wherein the signal electrode line is formed on the gate insulating layer, the protective film is formed over the signal electrode line, and a source connector is formed on the protective film and is electrically connected to the source electrode through the second hole, and to the signal electrode line through a third hole formed in the protective film.

3. The thin-film transistor according to claim 1, wherein the pixel electrode is formed on the gate insulating layer.

4. A liquid crystal display comprising:

a signal electrode line;

a pixel electrode; and a thin-film transistor for selectively applying a signal from the signal electrode line to the pixel electrode, the thin-film transistor including:

a substrate;

a gate electrode formed on the substrate, the gate electrode having a first width measured in a first direction;

a gate insulating layer formed on the gate electrode;

a semiconductor layer formed on the gate insulating layer, the semiconductor layer having a second width measured in the first direction and including opposing first and second ends and a channel region located between the first and second ends;

an ohmic contact layer formed on the semiconductor layer;

a source electrode formed on the ohmic contact layer over the first end of the semiconductor layer;

a drain electrode formed on the ohmic contact layer over the second end of the semiconductor layer such that the drain electrode is spaced apart from source electrode by the channel region of the semiconductor layer; and a protective film formed on the gate insulating layer, the source electrode, the channel region of the semiconductor layer, and the drain electrode;

wherein the pixel electrode is electrically connected to the drain electrode through a first hole in the protective film;

wherein the signal electrode line is electrically connected to the source electrode through a second hole in the protective film;

wherein the first width of the gate electrode is greater than the second width of the semiconductor layer, and wherein the source electrode and the drain electrode are formed between the first and second ends of the semiconductor layer.

5. The liquid crystal display according to claim 4, wherein the signal electrode line is formed on the gate insulating layer, the protective film is formed over the signal electrode line, and a source connector is formed on the protective film and is electrically connected to the source electrode through the second hole, and to the signal electrode line through a third hole formed in the protective film.

6. The liquid crystal according to claim 4, wherein the pixel electrode is formed on the gate insulating layer.

7. The liquid crystal according to claim 4, further comprising a backlight disposed such that the substrate is located between the backlight and the thin-film transistor.

* * * * *